US010545515B2

(12) United States Patent
Truong et al.

(10) Patent No.: US 10,545,515 B2
(45) Date of Patent: Jan. 28, 2020

(54) VIRTUALIZED FAN SPEED MEASUREMENT

(71) Applicant: HEWLETT PACKARD ENTERPRISE DEVELOPMENT LP, Houston, TX (US)

(72) Inventors: Huong M. Truong, Houston, TX (US); Alex Olson, Houston, TX (US); Kurt A. Manweiler, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 412 days.

(21) Appl. No.: 15/500,071

(22) PCT Filed: Apr. 27, 2015

(86) PCT No.: PCT/US2015/027760
§ 371 (c)(1),
(2) Date: Jan. 30, 2017

(87) PCT Pub. No.: WO2016/175741
PCT Pub. Date: Nov. 3, 2016

(65) Prior Publication Data
US 2017/0242446 A1 Aug. 24, 2017

(51) Int. Cl.
*G06N 5/04* (2006.01)
*G05D 13/62* (2006.01)
(Continued)

(52) U.S. Cl.
CPC ............. *G05D 13/62* (2013.01); *G05B 15/02* (2013.01); *G06F 1/3243* (2013.01);
(Continued)

(58) Field of Classification Search
CPC ...... G05B 15/02; G05D 13/62; G06F 1/3243; G06F 1/3296; H04L 2012/40215; H05K 7/20727; H05K 7/20836
See application file for complete search history.

(56) References Cited

U.S. PATENT DOCUMENTS 6,650,074 B1 * 11/2003 Vyssotski ............... G06F 1/206
318/400.12
7,275,380 B2 10/2007 Durant et al.
(Continued)

FOREIGN PATENT DOCUMENTS

KR 10-2012-0043131 5/2012

OTHER PUBLICATIONS

How to Adjust the Fan Thresholds of a Dell PowerEdge, (Web Page); Nov. 15, 2011; http://projects.nuschkys.net/2011/11/15/how-to-adjust-the-fan-thresholds-of-a-dell-poweredge; 144 Pages.
(Continued)

*Primary Examiner* — Muhammad S Islam
(74) *Attorney, Agent, or Firm* — Nolte Intellectual Property Law Group

(57) ABSTRACT

Example implementations relate to virtualizing fan speed. For example, a system for virtualizing fan speed may include a server enclosure manager connected to a controller area network (CAN) bus, the server enclosure manager to regulate a speed of a fan in a server blade enclosure; and a CAN bus microcontroller connected to the CAN bus. The CAN bus microcontroller may receive a direct current (DC) voltage from an analog low-pass filter, determine a fan speed of the fan corresponding to the received DC voltage, and report the determined fan speed to the enclosure manager.

20 Claims, 4 Drawing Sheets

(51) Int. Cl.
*G05B 15/02* (2006.01)
*G06F 1/3234* (2019.01)
*G06F 1/3296* (2019.01)
*H04L 12/40* (2006.01)
*H04L 25/49* (2006.01)
*H05K 7/20* (2006.01)

(52) U.S. Cl.
CPC ............ *G06F 1/3296* (2013.01); *H04L 12/40* (2013.01); *H04L 25/4902* (2013.01); *H05K 7/20727* (2013.01); *H05K 7/20836* (2013.01); *H04L 2012/40215* (2013.01)

(56) References Cited

U.S. PATENT DOCUMENTS

| | | | | |
|---|---|---|---|---|
| 7,479,753 | B1* | 1/2009 | Mimberg | H02P 7/29 318/254.2 |
| 2006/0121421 | A1* | 6/2006 | Spitaels | G06F 1/206 434/118 |
| 2008/0041077 | A1* | 2/2008 | Tutunoglu | F25D 19/00 62/186 |
| 2008/0281475 | A1 | 11/2008 | Hirai et al. | |
| 2009/0138313 | A1* | 5/2009 | Morgan | G06Q 10/06 705/7.23 |
| 2009/0234936 | A1 | 9/2009 | Bandholz et al. | |
| 2010/0042562 | A1* | 2/2010 | Mace | H05K 7/20836 706/12 |
| 2011/0054705 | A1 | 3/2011 | Vaidyanathan | |
| 2013/0135820 | A1 | 5/2013 | Wang | |
| 2013/0170134 | A1 | 7/2013 | Shih et al. | |
| 2014/0362526 | A1 | 12/2014 | Wang | |

OTHER PUBLICATIONS

The International Search Report and the Written Opinion of the International Searching Authority; dated Feb. 18, 201; 13 pages.

* cited by examiner

VIRTUALIZED FAN SPEED MEASUREMENT

BACKGROUND

A network may communicate and exchange information. As an important tool to provide network services, a server may process large amounts of data. Owing to demands for large amounts of data, multiple servers may be packaged together in a server blade enclosure. Devices in the server blade enclosure, including servers, may generate heat during operation. A fan or a plurality of fans may be incorporated in the server blade enclosure to regulate the temperature of the server blade enclosure.

DETAILED DESCRIPTION

In a server blade enclosure, a thermal management infrastructure is a shared resource used for cooling several devices in the server blade enclosure, such as servers and interconnects, among other devices. In such an environment, it may be advantageous to centrally acquire information on the cooling needs of each device. Such information may be in the form of a 'desired fan speed' for devices that are used to directly control a fan in the server blade enclosure. As used herein, a desired fan speed may refer to a fan speed requested by a device in a server blade enclosure to meet the cooling needs of the device.

Fan speed control may be implemented using a digital controller that is programmed to maintain the server blade enclosure temperature at a fixed temperature set-point. For example, the controller may first measure current fan speed using a tachometer feedback signal. The controller may next measure the server blade enclosure temperature using a temperature sensor. If the controller determines that the server blade enclosure temperature exceeds the temperature set-point, the controller may increase fan speed slightly, increasing airflow and thus causing the server blade enclosure temperature to decrease. Conversely, if the server blade enclosure temperature is less than the temperature set-point, the controller may decrease fan speed slightly, reducing airflow and thus allowing the server blade enclosure temperature to increase. In order to determine the amount of speed adjustment necessary, the controller may calculate a new fan speed output based on the temperature error (i.e., the difference between the current server blade enclosure temperature and the temperature set-point) and the current speed output. The calculated speed output and the measured fan speed may be compared to determine the actual increase or decrease in fan speed required. These steps may be repeated continuously, with a sufficient time delay introduced between iterations to allow the server blade enclosure temperature to sufficiently react to airflow changes.

However, challenges may arise in how to acquire the desired fan speed from the devices in the server blade enclosure. Some solutions may include modifying firmware in the server blade enclosure, and utilizing complex communication channels such as an intelligent platform management interface (IPMI) over Ethernet to communicate the desired fan speed from the devices to the fan. In contrast, virtualized fan speed measurement in accordance with the present disclosure includes extraction of requested fan speed information from a server without server firmware modification, enabling a shared fan or fans to adequately meet the cooling needs of the devices in the server blade enclosure.

Figure 1:
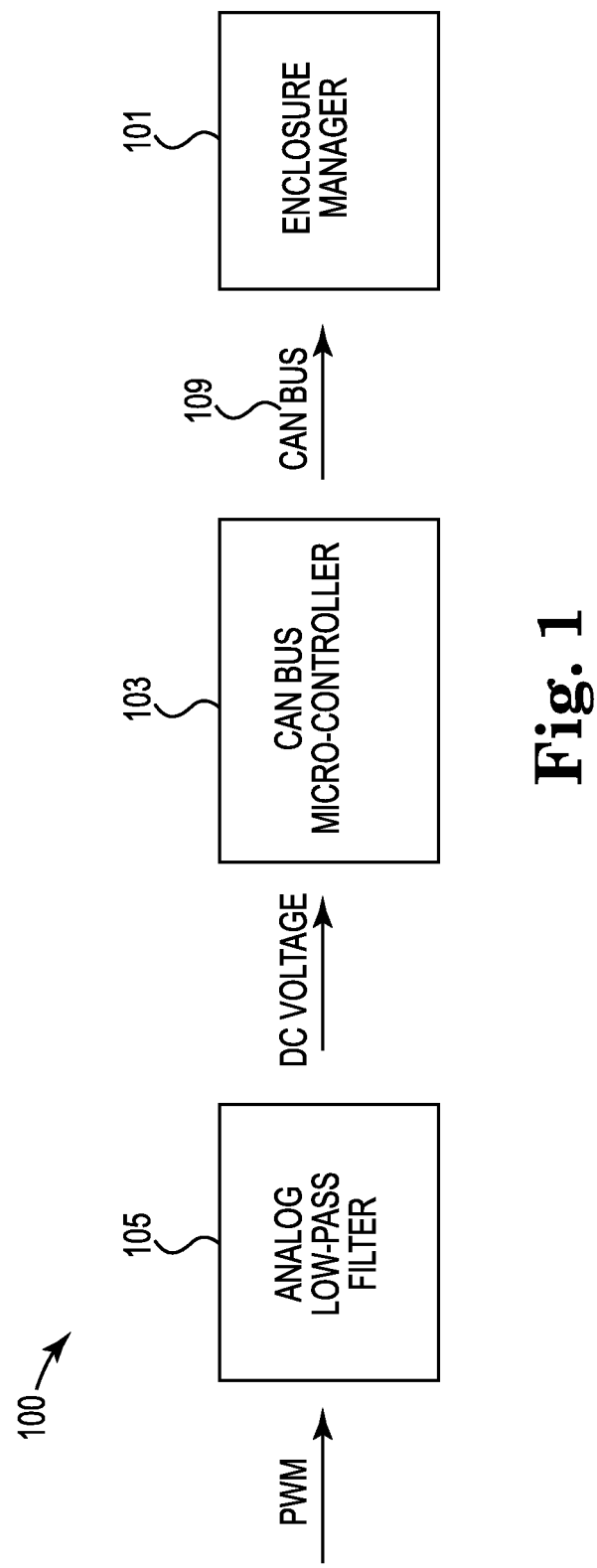
FIG. 1 illustrates an example system for virtualized fan speed measurement according to the present disclosure.

FIG. 1 illustrates an example system 100 for virtualized fan speed measurement according to the present disclosure. As illustrated in FIG. 1, the system 100 may include a server enclosure manager 101, a controller area network (CAN) bus microcontroller 103, an analog low-pass filter 105, and a CAN bus 109, among other components.

The server enclosure manager 101 may be connected to the CAN bus 109. As used herein, a CAN bus refers to a multi-master, message broadcast system. Unlike network systems such as universal serial bus (USB) systems or Ethernet, a CAN bus does not send large blocks of data point-to-point from devices under the supervision of a central bus master. In a CAN bus, many short messages like temperature may be broadcast to an entire network, such as a server blade enclosure. The server enclosure manager 101 may communicate with various components in the server blade enclosure. For instance, the server enclosure manager 101 may communicate a desired fan speed to a fan or plurality of fans within the server blade enclosure. As such, the server enclosure manager may regulate a speed of a fan in the server blade enclosure.

The CAN bus microcontroller 103 may also be connected to the CAN bus 109. As used herein, a CAN bus microcontroller refers to a microcontroller that is CAN bus enabled. Put another way, the CAN bus microcontroller 103 may refer to a microcontroller that is capable of communicating over a CAN bus. The CAN bus microcontroller 103 may also be coupled to an analog low-pass filter 105. As used herein, an analog low-pass filter refers to a filter that passes signals with a frequency lower than a certain threshold frequency, and attenuates signals with frequencies higher than the threshold frequency.

As described further herein, the analog low-pass filter 105 may convert a pulse-width modulated (PWM) output received from a baseboard management controller (BMC) unit, into a direct current (DC) voltage. The BMC unit may be a specialized microcontroller, system on a chip (SoC), etc., that manages the interface between system (e.g., server blade enclosure) management software and platform hardware. For example, different types of sensors built into the server blade enclosure may report to the BMC unit on parameters such as temperature, cooling fan speeds, power status, and operating system status, among other parameters. The BMC unit may then send a PWM signal to the analog low-pass filter 105 to virtualize the desired fan speed in the server blade enclosure. In some examples, the analog low-pass filter 105 may be a resistor-capacitor filter. As used herein, a resistor-capacitor filter may refer to an electric circuit composed of resistors and capacitors driven by a voltage or current source.

The CAN bus microcontroller 103 may receive the DC voltage from the analog low-pass filter 105. In response to receiving the DC voltage from the analog low-pass filter 105, the CAN bus microcontroller 103 may determine a fan speed of the fan corresponding to the received DC voltage. The determined fan speed may be a virtualized fan speed, such that the CAN bus microcontroller 103 receives an input signal as if it were connected to a physical fan, when in fact no fan is physically connected to the CAN bus microcontroller 103. After measuring the DC voltage, the CAN bus microcontroller 103 may report the determined (e.g., virtualized) fan speed to the enclosure manager 101, such that the enclosure manager 101 may regulate the fan speed accordingly. The enclosure manager 101 may communicate the desired fan speed to a CAN bus microcontroller for reconstruction of the PWM signal and output to a physical fan. The CAN bus microcontroller that reconstructs the PWM signal may be different than the CAN bus microcontroller 103 (e.g., the CAN bus microcontroller that received the DC voltage from the analog low-pass filter), although examples are not so limited. For instance, the CAN bus microcontroller may sample the DC voltage at various time intervals and reconstruct a duty cycle of the PWM output corresponding to the DC voltage. Put another way, a 75% duty-cycle PWM signal may be measured as a 75%-of-full-scale DC voltage. The CAN bus microcontroller 103 may report the determined fan speed to the enclosure manager 101 via the CAN bus 109. In such a manner, the CAN bus microcontroller 103 may report the determined fan speed to the enclosure manager 101 without modifying the BMC unit in the server blade enclosure.

Figure 2:
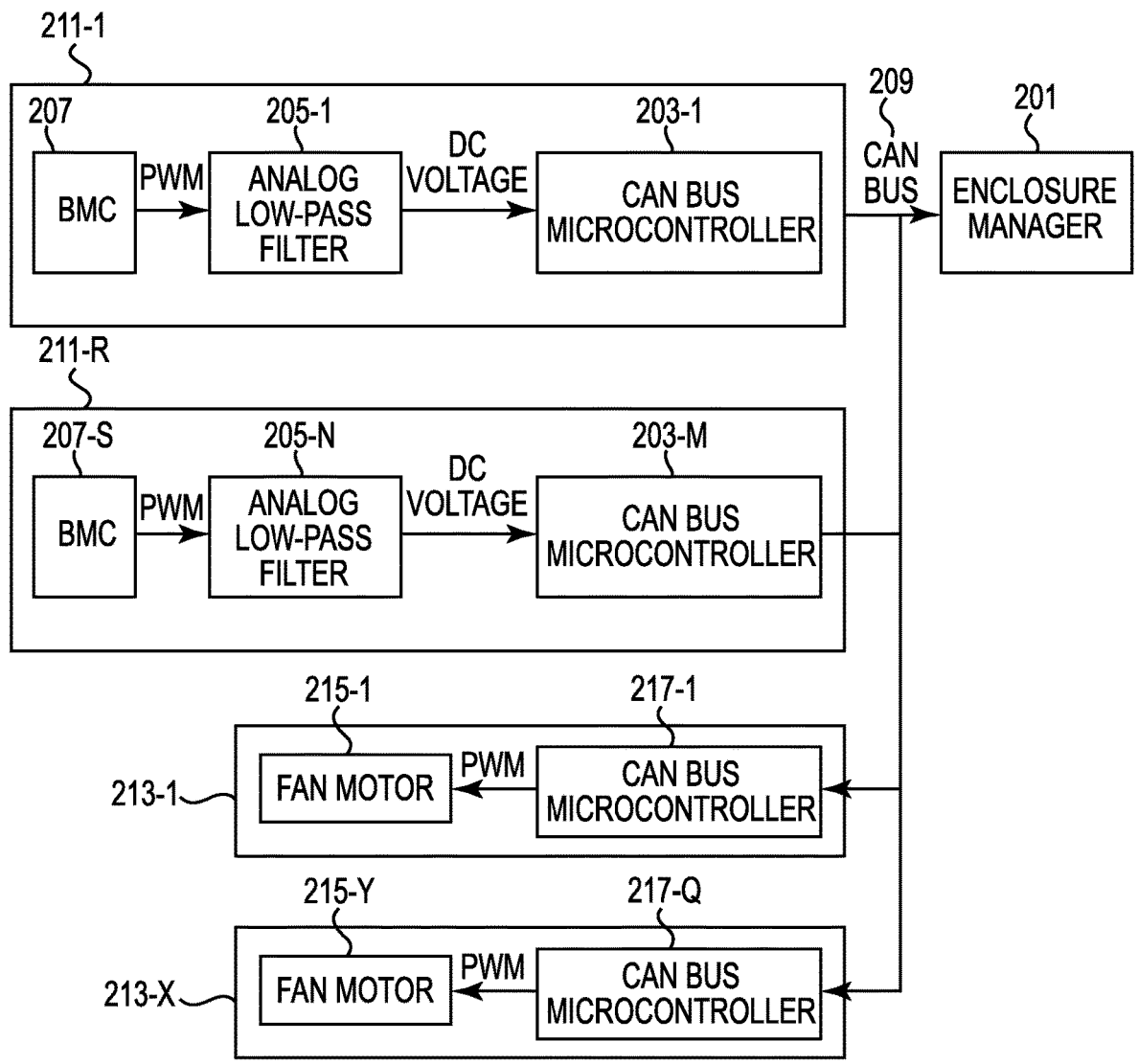
FIG. 2 illustrates an example system for virtualized fan speed measurement according to the present disclosure.

FIG. 2 illustrates an example system 200 for virtualized fan speed measurement according to the present disclosure. The system 200 may be a server blade enclosure including a plurality of servers 211-1, . . . , 211-R (collectively referred to herein as servers 211), a plurality of fans 213-1, . . . 213-X (collectively referred to herein as fans 213), and an enclosure manager 201, among other components. As illustrated in FIG. 2, the servers 211 and the fans 213 may be connected by a CAN bus 209.

Each server (e.g., 211-1, 211-R) in the server blade enclosure may include a plurality of components. For instance, each server may include a BMC unit 207-1, . . . , 207-S (collectively referred to herein as BMC units 207), an analog low-pass filter 205-1, . . . , 205-N (collectively referred to herein as analog low-pass filters 205), and a CAN bus microcontroller 203-1, . . . , 203-M (collectively referred to herein as CAN bus microcontrollers 203) among other components. Similarly, each of the fans 213 may include a fan motor 215-1, . . . 215-Y (collectively referred to herein as fan motors 215) as well as CAN bus microcontrollers 217-1, . . . 217-Q (collectively referred to as CAN bus microcontrollers 217). In such a manner, each of the servers 211 may communicate a desired fan speed to the enclosure manager 101, via the analog low-pass filters 205 and the CAN bus microcontrollers 203. As described in relation to FIG. 1, the analog-low pass filters 205 and CAN bus microcontrollers 203 may convert a PWM signal to a DC voltage corresponding to a desired fan speed, and send the converted DC voltage to the enclosure manager 101 via the CAN bus 209.

The enclosure manager 101 may further send an output signal to each of the fans 213 to regulate the fan speed. For instance, the enclosure manager 101 may send output signals to each of fan 213-1 and 213-X. Fans 213-1 and 213-X may each include a CAN bus microcontroller 217-1, and 217-Q, respectively, which may convert the received output signal (e.g., received from the enclosure manager 101) to a PWM signal, and each CAN bus microcontroller 217 may send the converted PWM signal to the fan motor 215-1, 215-Y, respectively.

In some examples, the PWM signals received by the fan motors 215 may correspond to the PWM signals received by the analog low-pass filters 205. However, examples are not so limited, and in some examples the PWM signals received by the fan motors 215 may be different than the PWM signals received by the analog low-pass filters 205. For instance, the BMC unit 207-1 may send a PWM signal associated with a first desired fan speed to the enclosure manager 101 (e.g., via analog low-pass filter 205-1 and CAN bus microcontroller 203-1), and the BMC unit 207-S may send a PWM signal associated with a second desired fan speed to the enclosure manager 101 (e.g., via analog low-pass filter 205-N and CAN bus microcontroller 203-M). The enclosure manager 101 may determine an optimal fan speed for each of fans 213-1 and 213-X in response to receiving the desired fan speeds. In some examples, each of fans 213-1 and 213-X may be set at a same speed. However, examples are not so limited and each of fans 213-1 and 213-X may be set to a different speed. Similarly, while FIG. 2 illustrates two fans and two servers, examples are not so limited and the system 200 may include more or fewer servers 211 and more or fewer fans 213 than illustrated.

Figure 3:
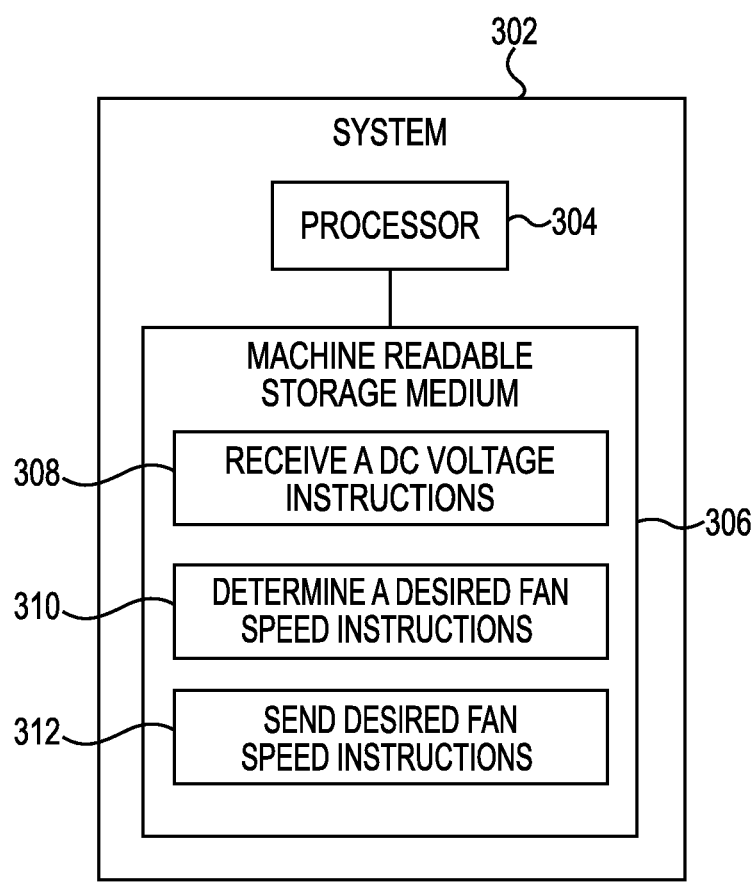
FIG. 3 is a block diagram of an example system for virtualized fan speed measurement, according to the present disclosure.

FIG. 3 is a block diagram of an example system 302 for virtualizing fan speed measurement, according to the present disclosure. System 302 may include at least one computing device that is capable of communicating with at least one remote system. System 302 may be similar to system 100 of FIG. 1, for example. In the example of FIG. 3, system 302 includes a processor 304 and a machine-readable storage medium 306. Although the following descriptions refer to a single processor and a single machine-readable storage medium, the descriptions may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 304 may be one or more central processing units (CPUs), microprocessors, and/or other hardware devices suitable for retrieval and execution of instructions stored in machine-readable storage medium 306. In the particular embodiment shown in FIG. 3, processor 304 may receive, determine, and send instructions 308, 310, 312 for virtualizing fan speed measurement. As an alternative or in addition to retrieving and executing instructions, processor 304 may include one or more electronic circuits comprising a number of electronic components for performing the functionality of one or more of the instructions in machine-readable storage medium 306. With respect to the executable instruction representations (e.g., boxes) described and shown herein, it should be understood that part or all of the executable instructions and/or electronic circuits included within one box may, in alternate embodiments, be included in a different box shown in the figures or in a different box not shown.

Machine-readable storage medium 306 may be any electronic, magnetic, optical, or other physical storage device that stores executable instructions. Thus, machine-readable storage medium 306 may be, for example, Random Access Memory (RAM), an Electrically-Erasable Programmable Read-Only Memory (EEPROM), a storage drive, an optical disc, and the like. Machine-readable storage medium 306 may be disposed within system 302, as shown in FIG. 3. In this situation, the executable instructions may be "installed" on the system 302. Alternatively, machine-readable storage medium 306 may be a portable, external or remote storage medium, for example, that allows system 302 to download the instructions from the portable/external/remote storage medium. In this situation, the executable instructions may be part of an "installation package". As described herein, machine-readable storage medium 306 may be encoded with executable instructions for virtualizing fan speed measurement.

Referring to FIG. 3, receive a DC voltage instructions 308, when executed by a processor (e.g., 304), may cause system 302 to receive, at a controller CAN bus microcontroller, a DC voltage. For instance, the machine readable storage medium 306 may store instructions that when executed by the processor 304, may receive, at a CAN bus microcontroller 203-1, a DC voltage, the DC voltage sent from an analog low-pass filter 205-1 and corresponding to a high-frequency PWM signal received by the analog low-pass filter 205-1. As discussed in relation to FIG. 2, the PWM signal may be received from a BMC unit 207-1.

Determine a desired fan speed instructions 310, when executed by a processor (e.g., 304), may cause system 302 to determine, using the CAN bus microcontroller, a desired fan speed of a fan in a server blade enclosure corresponding to the received DC voltage. For example, the machine readable storage medium 306 may store instructions that when executed by the processor 304, may determine, using the CAN bus microcontroller 203-1, a desired fan speed of fan 213-1 in the server blade enclosure 200 corresponding to the received DC voltage.

Send desired fan speed instructions 312, when executed by a processor (e.g., 304), may cause system 302 to send, from the CAN bus microcontroller to an enclosure manager, the desired fan speed. For instance, the machine readable storage medium 306 may store instructions that when executed by the processor 304, may send, from the CAN bus microcontroller 203-1 to an enclosure manager 201, the desired fan speed.

In some examples, the machine readable storage medium 306 may store instructions that when executed by the processor 304 may sample, using the CAN bus microcontroller, the DC voltage and reconstruct a duty cycle of the PWM signal from the sampled DC voltage. For instance, the machine readable storage medium 306 may store instructions that when executed by the processor 304, may use CAN bus microcontroller 217-1 to reconstruct the duty cycle of the PWM signal received from BMC unit 207-1. As such, the machine readable storage medium 306 may store instructions that when executed by the processor 304, may send the desired fan speed to the fan 213-1 in response to the reconstruction of the duty cycle by the CAN bus microcontroller 217-1.

Further, the machine readable storage medium 306 may store instructions that when executed by the processor 304 may send the desired fan speed to and/or from the enclosure manager via a CAN bus. For example, the machine readable storage medium 306 may store instructions that when executed by the processor 304 may send from CAN bus microcontroller 203-1 to enclosure manager 201 via CAN bus 209, a desired fan speed for fan 213-3. Similarly, the machine readable storage medium 306 may store instructions that when executed by the processor 304 may send from enclosure manager 201 to the CAN bus microcontroller 217-1 via CAN bus 209, the desired fan speed.

Figure 4:
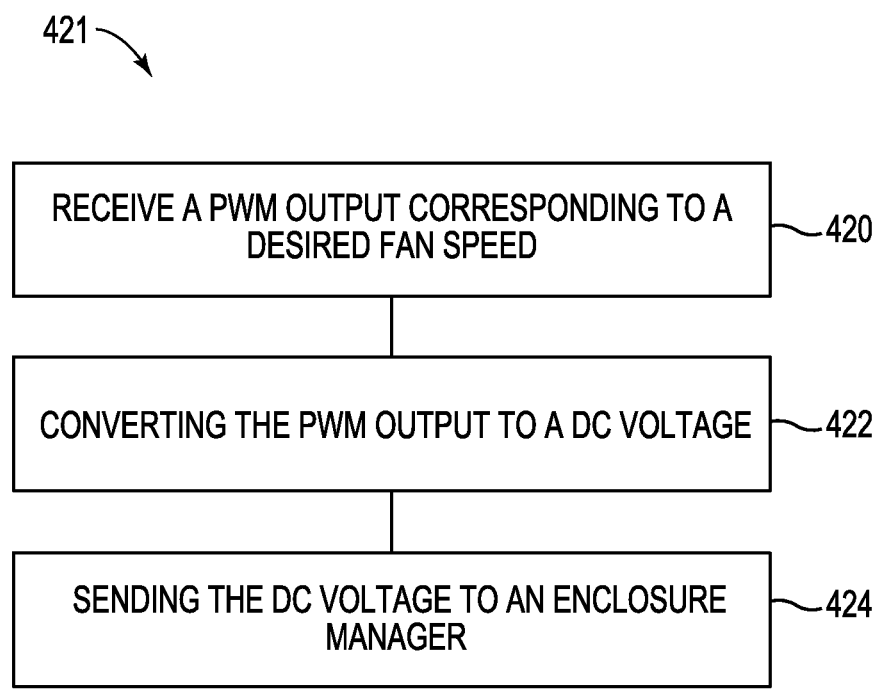
FIG. 4 illustrates an example method according to the present disclosure.

FIG. 4 illustrates an example method 421 according to the present disclosure. At 420, the method 421 may include receiving, by an analog low-pass filter, a PWM output corresponding to a desired fan speed of a fan in a server blade enclosure. In some examples, receiving the PWM output corresponding to the desired fan speed includes receiving the PWM output from a BMC unit.

At 422, the method 421 may include converting, by the analog low-pass filter, the PWM output to a DC voltage. In some examples, converting the PWM output to the DC voltage includes converting the PWM output to a near constant DC voltage. As used herein, a "near constant" DC voltage may refer to an average DC voltage, and/or a DC voltage within a specified threshold range.

At 424, the method 421 may include sending, from the analog low-pass filter to an enclosure manager via a CAN bus microcontroller, the DC voltage. In some examples, sending the DC voltage to the enclosure manager includes sending the DC voltage to the enclosure manager via a CAN bus.

In some examples, the method 421 may further include regulating, using the enclosure manager, the speed of the fan in the server blade enclosure in response to receiving the DC voltage from the analog low-pass filter.

Also, the method 421 may further include reconstructing, using the CAN bus microcontroller, a duty cycle of the PWM output corresponding to the DC voltage. For instance, as described in relation to FIG. 2, each of CAN bus microcontrollers 217-1 and 217-Q may reconstruct a duty cycle of the PWM output, and send the reconstructed PWM signal to each of fans 215-1 and 215-Y.

In the foregoing detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. As used herein, the designators "M", "N,", "Q", "S", "X" and "Y", particularly with respect to reference numerals in the drawings, indicate that a number of the particular feature so designated can be included with examples of the present disclosure. The designators can represent the same or different numbers of the particular features. Further, as used herein, "a number of" an element and/or feature can refer to one or more of such elements and/or features.

As used herein, "logic" is an alternative or additional processing resource to perform a particular action and/or function, etc., described herein, which includes hardware, e.g., various forms of transistor logic, application specific integrated circuits (ASICs), etc., as opposed to computer executable instructions, e.g., software firmware, etc., stored in memory and executable by a processor.

What is claimed:

1. A system for virtualized fan speed, comprising:
    a server blade enclosure;
    a server enclosure manager connected to a controller area network (CAN) bus, the server enclosure manager to regulate a speed of a fan in the server blade enclosure;
    a blade disposed within the server blade enclosure; and
    a CAN bus microcontroller disposed on the blade in the server blade enclosure and connected to the CAN bus, the CAN bus microcontroller to:

receive a direct current (DC) voltage from an analog low-pass filter, the DC voltage corresponding to a virtualized fan speed;

determine the virtualized fan speed of the fan corresponding to the received DC voltage; and report the virtualized fan speed to the server enclosure manager.

2. The system of claim 1, further comprising the CAN bus microcontroller to sample the DC voltage and reconstruct a duty cycle of a pulse-width-modulated (PWM) output corresponding to the DC voltage.

3. The system of claim 1, wherein the analog low-pass filter is a resistor-capacitor filter.

4. The system of claim 1, further comprising the CAN bus microcontroller to report the virtualized fan speed to the enclosure manager via the CAN bus.

5. The system of claim 1, further comprising the CAN bus microcontroller to report the virtualized fan speed to the enclosure manager without modifying a baseboard management controller in the server blade enclosure.

6. A non-transitory machine readable medium storing instructions executable by a processing resource to:

receive, at a controller area network (CAN) bus microcontroller, a direct current (DC) voltage, the DC voltage sent from an analog low-pass filter and corresponding to a high-frequency pulse-width-modulated (PWM) signal received by the analog low-pass filter;

determine, using the CAN bus microcontroller, a fan speed of a fan in a server blade enclosure corresponding to the received DC voltage;

send, from the CAN bus microcontroller to an enclosure manager, the fan speed; and provide the fan speed from the enclosure manager to at least one fan in the server blade enclosure.

7. The non-transitory medium of claim 6, wherein the instructions to send from the CAN bus microcontroller to the enclosure manager, the fan speed, include instructions to send the fan speed to the enclosure manager via a CAN bus.

8. The non-transitory medium of claim 6, further including instructions to sample, using the CAN bus microcontroller, the DC voltage and reconstruct a duty cycle of the PWM signal from the sampled DC voltage.

9. The non-transitory medium of claim 8, further including instructions to send the desired fan speed to the fan in response to the reconstruction of the duty cycle by the CAN bus microcontroller.

10. A method for virtualized fan speed measurement, comprising:

receiving, by an analog low-pass filter, a pulse-width modulated (PWM) output corresponding to a virtualized fan speed of a fan from a board management controller disposed on a blade in a server blade enclosure;

converting, by the analog low-pass filter, the PWM output to a direct current (DC) voltage; and sending, from the analog low-pass filter to an enclosure manager via a controller area network (CAN) bus microcontroller, the DC voltage.

11. The method of claim 10, wherein receiving the PWM output corresponding to the virtualized fan speed includes receiving the PWM output from a baseboard management controller (BMC).

12. The method of claim 10, wherein converting the PWM output to the DC voltage includes converting the PWM output to a near constant DC voltage.

13. The method of claim 10, wherein sending the DC voltage to the enclosure manager includes sending the DC voltage to the enclosure manager via a CAN bus.

14. The method of claim 10, further comprising regulating, using the enclosure manager, the speed of the fan in the server blade enclosure in response to receiving the DC voltage from the analog low-pass filter.

15. The method of claim 10, further comprising reconstructing, using the CAN bus microcontroller, a duty cycle of the PWM output corresponding to the DC voltage.

16. The system of claim 1, wherein the server enclosure manager provides the desired fan speed to at least one fan in a server blade enclosure.

17. The non-transitory medium of claim 6, wherein the PWM signal received by the analog low-pass filter is received from a board management controller disposed on a blade in the server blade enclosure.

18. The non-transitory medium of claim 6, wherein the CAN bus microcontroller is disposed on a blade in the server blade enclosure.

19. The method of claim 10, wherein the PWM output is received by the analog low-pass filter from a board management controller that is disposed on a blade in the several blade enclosure.

20. The method of claim 19, wherein the CAN bus microcontroller is disposed on the blade.

* * * * *